United States Patent
Chang et al.

(10) Patent No.: US 7,098,097 B2
(45) Date of Patent: Aug. 29, 2006

(54) MASS-PRODUCTION PACKAGING MEANS AND MASS-PRODUCTION PACKAGING METHOD

(75) Inventors: Yih Chang, Taipei (TW); Mau-Kuo Wei, Taipei (TW); Jih-Yi Wang, Taipei (TW); Chou-Ho Shyu, Tainan (TW); Yung-Wei Lai, Janghua (TW)

(73) Assignee: RiTdisplay Corporation, Hsinchu (TW)

( * ) Notice: Subject to any disclaimer, the term of this patent is extended or adjusted under 35 U.S.C. 154(b) by 832 days.

(21) Appl. No.: 09/852,188

(22) Filed: May 8, 2001

(65) Prior Publication Data

US 2002/0034838 A1    Mar. 21, 2002

(30) Foreign Application Priority Data

Sep. 18, 2000   (TW) .................................. 89119122

(51) Int. Cl.
*H01L 21/66* (2006.01)
*H01L 21/00* (2006.01)

(52) U.S. Cl. .......................... 438/206; 438/25; 438/16; 438/26; 438/51; 438/55; 438/69

(58) Field of Classification Search ................ 438/103
See application file for complete search history.

(56) References Cited

U.S. PATENT DOCUMENTS

| | | | |
|---|---|---|---|
| 5,814,156 A * | 9/1998 | Elliott et al. ................ 134/1 |
| 5,882,761 A | 3/1999 | Kawami et al. |
| 5,900,615 A | 5/1999 | Katoh et al. |
| 5,958,778 A | 9/1999 | Kidd |
| 5,962,962 A | 10/1999 | Fujita et al. |
| 5,990,615 A * | 11/1999 | Sakaguchi et al. ......... 313/504 |
| 6,013,538 A * | 1/2000 | Burrows et al. ............. 438/22 |
| 6,049,167 A | 4/2000 | Onitskua et al. |
| 6,150,536 A * | 11/2000 | Chondroudis et al. ........ 549/2 |
| 6,175,189 B1 * | 1/2001 | Brooks ..................... 315/119 |
| 6,316,278 B1 * | 11/2001 | Jacobsen et al. ............ 438/22 |
| 6,458,475 B1 * | 10/2002 | Adachi et al. ............. 428/690 |
| 6,522,067 B1 * | 2/2003 | Graff et al. ................ 313/512 |
| 6,612,888 B1 * | 9/2003 | Pai et al. .................... 445/24 |
| 6,744,199 B1 * | 6/2004 | Tanaka ...................... 313/512 |
| 6,776,880 B1 * | 8/2004 | Yamazaki ............. 204/192.15 |
| 6,800,225 B1 * | 10/2004 | Hagmann et al. ......... 264/1.36 |
| 2002/0017864 A1 * | 2/2002 | Watanabe et al. ........... 313/586 |
| 2002/0185967 A1 * | 12/2002 | Friend ........................ 313/504 |

FOREIGN PATENT DOCUMENTS

JP          02198662      *   8/1990

* cited by examiner

*Primary Examiner*—Carl Whitehead, Jr.
*Assistant Examiner*—James M. Mitchell
(74) *Attorney, Agent, or Firm*—J.C. Patents

(57) ABSTRACT

A mass-production packaging means suitable for mass-production packaging of an organic luminescent display. An organic electroluminescent display panel on which an organic luminescent device has been formed is first provided. Then, an UV laser is used to clean the surface of the organic electroluminescent display panel. A molding compound is applied on the organic electroluminescent display panel by a sizing system. Subsequently, a lid is aligned with the organic electroluminescent display panel and lamination is performed. Finally, the molding compound is irradiated with UV light to be cured. The package is thus completed.

9 Claims, 9 Drawing Sheets

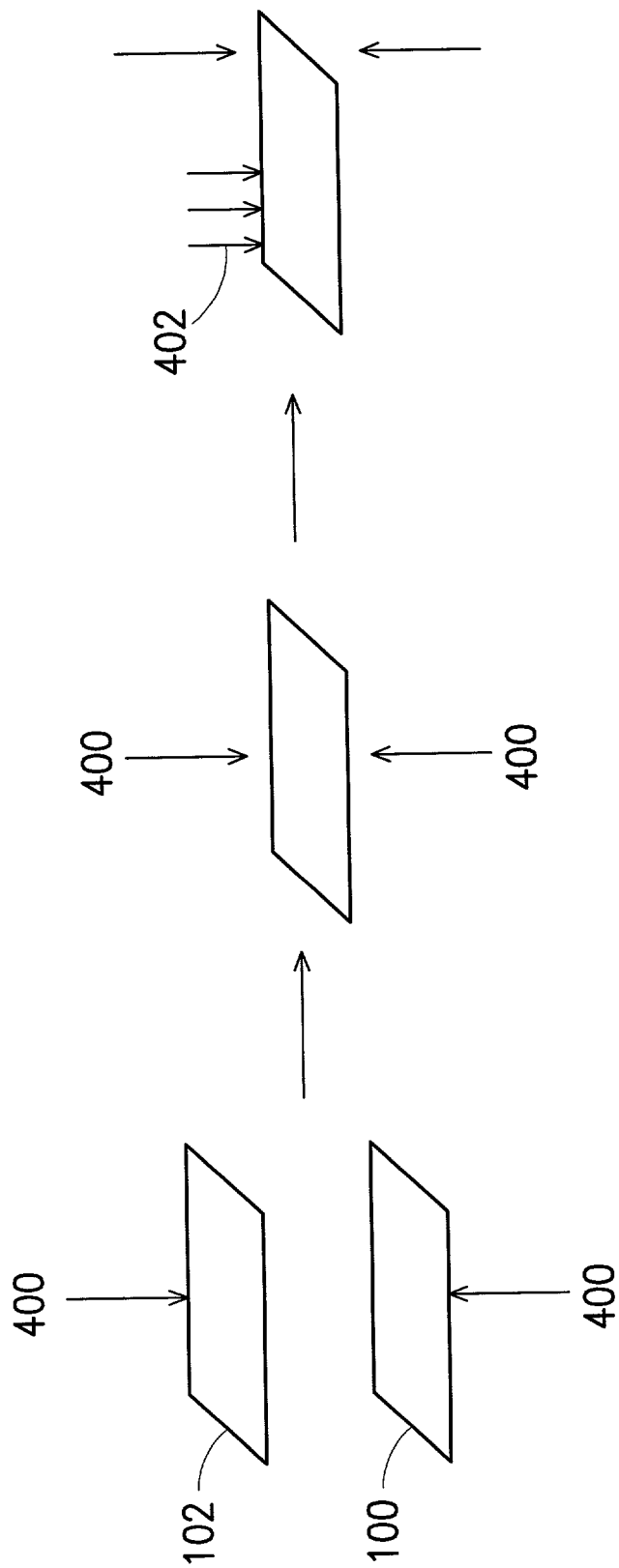

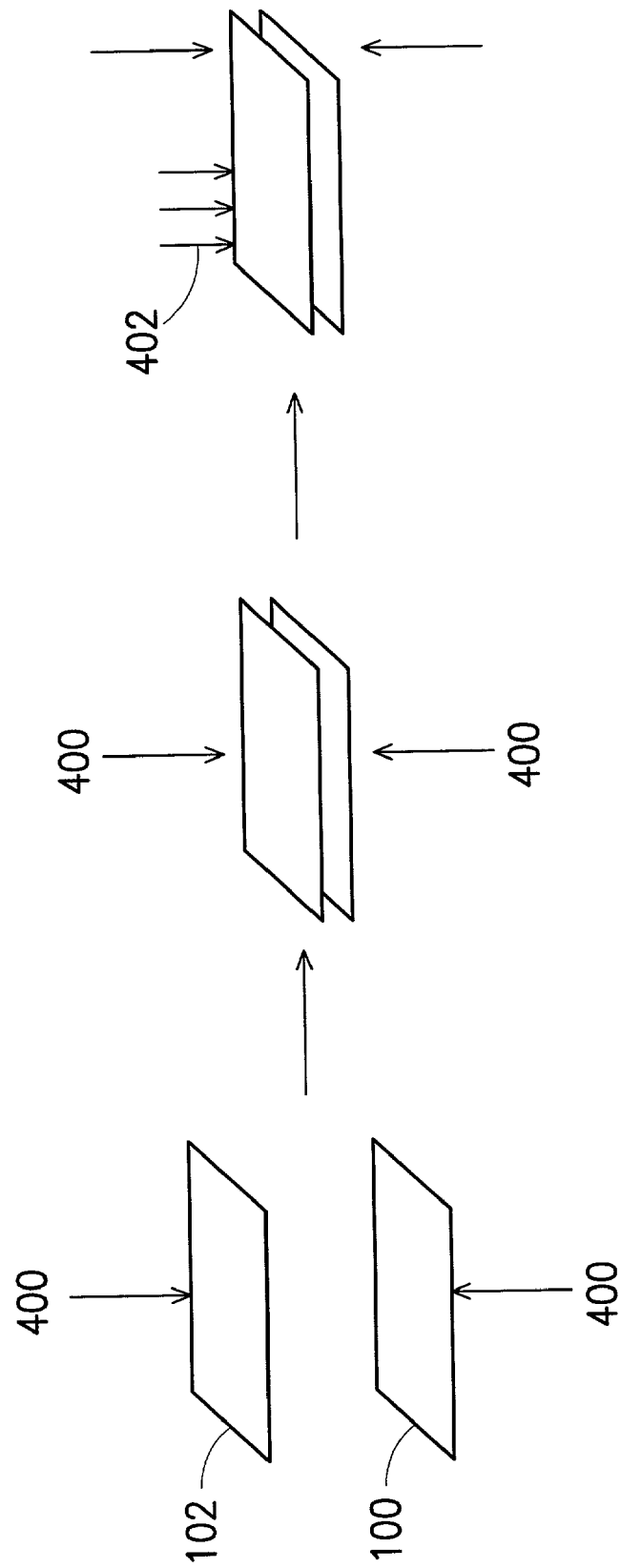

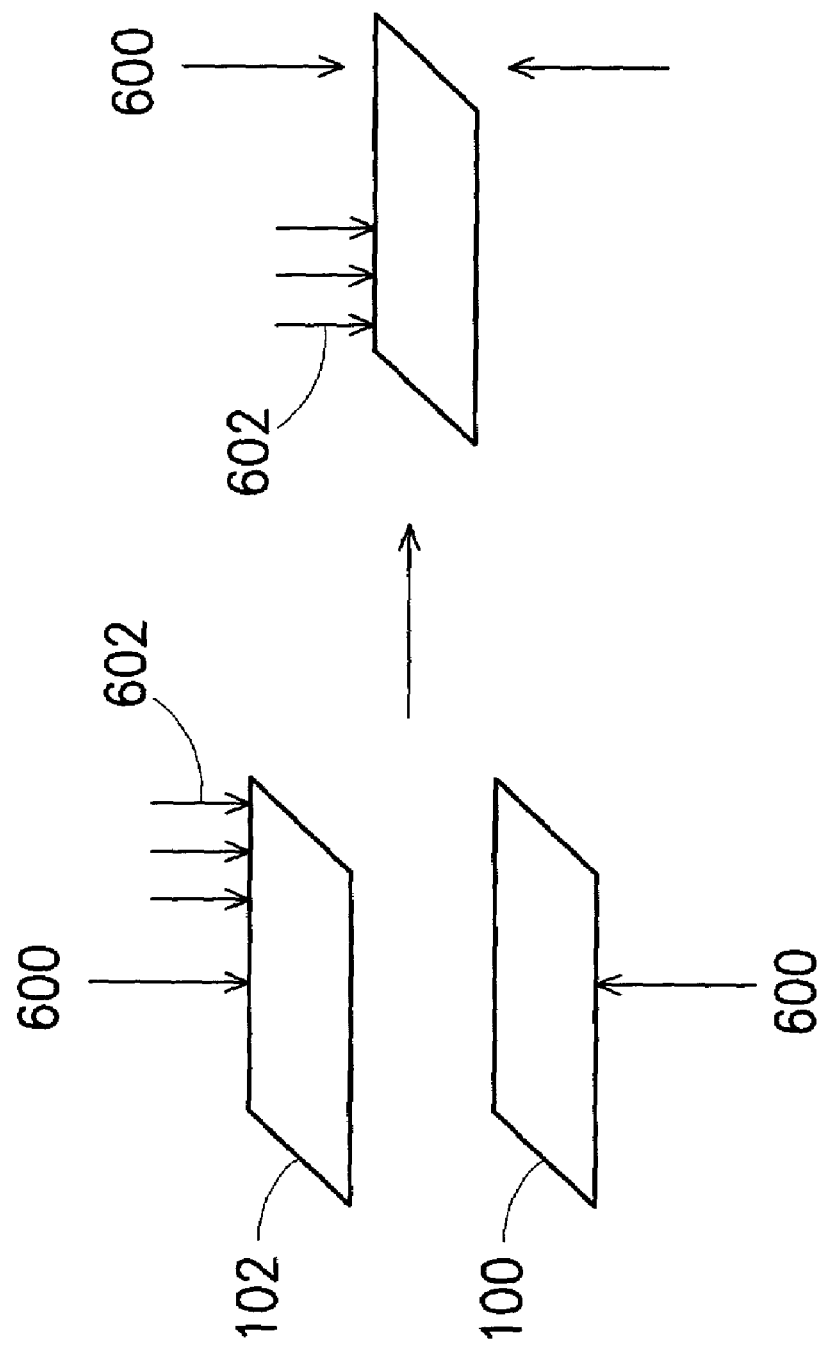

MASS-PRODUCTION PACKAGING MEANS AND MASS-PRODUCTION PACKAGING METHOD

CROSS-REFERENCE TO RELATED APPLICATION

This application claims the priority benefit of Taiwan application Ser. No. 89119122, filed Sep. 18, 2000.

BACKGROUND OF THE INVENTION

1. Field of the Invention

The present invention relates to a mass-production packaging means for an organic electroluminescent display (OLED) and a process therefor.

2. Description of the Related Art

Since an organic small molecule electroluminescent device was proposed by US Kodak company in *Appl, Phys. Lett.*, Vol. 5, p. 914 (1987) and a polymer material was successfully applied to the electroluminescent device as published in *Nature, Vol.* 347, p. 539 (1990) by Cambridge University, Britain, the electroluminescent device has been proved to be put into practice. Therefore, many attempts of related research and development have been proposed in many countries.

The organic electroluminescent device has advantages such as self-luminescence, board visual angle (up to 160 degrees), high feedback speed, low driving voltage, full color, etc., that it is considered a new-generation plane display technology. Currently, the organic electroluminescent device is approaching the stage of actual usage and is expected to be the material for a new-generation color plane display. The high level application for the plane luminescent device aims at full color plane display devices, such as small display panels, out-door display panels, and computer and television monitors. However, since the development of this new technology started later than other displays, the new technology still can not be put into practice. Currently, only Japan Pioneer company produces small-size related products. This reveals that the commercialization of the organic electroluminescent display needs to overcome a lot of obstacles, especially in mass production.

At present, most of the attempts of research and development of the organic electroluminescent device focus on the structure of the device and material therefor. Few packaging technologies are known in the art. A summary of the related prior art is as follows:

1. U.S. Pat. No. 5,882,761 to Pioneer discloses a packaging method for an organic electroluminescent device, and a hygroscopic material. However, no description about a mass-production method is provided.
2. U.S. Pat. No. 6,049,167 to TDK discloses a packaging method for an organic electroluminescent device. However, a water-absorptive material is not included. The equipment for the package is batch type equipment, which is suitable only for a laboratory, not for mass production.
3. U.S. Pat. No. 5,958,778 to IBM discloses a packaging method for an organic electroluminescent device, which is characterized by a multilayer protective film and glass or metal used to package the device. However, mass-production of a multilayer film is considerably difficult. Moreover, the adhesion between different materials is also hard to imrpove. Therefore, the IBM method is not useful in a mass-production packaging method.
4. U.S. Pat. No. 5,962,962 to Idemitsu discloses a packaging method for an organic electroluminescent device, which is characterized in that non-active liquid having a hygroscopic material is used to protect the device. However, all of the materials used must be demoisturized to ensure the performance thereof. Therefore, the Idemitsu method is not suitable in a mass-production packaging.
5. U.S. Pat. No. 5,990,615 to NEC discloses a packaging method of an organic electroluminescent device, which is characterized over Pioneer and Idemitsu in that a protective layer is additionally provided on the device. However, similar disadvantages as that in the Pioneer and Idemitsu methods still exist.

As discussed above, in the prior packaging methods, no teaching shows how to carry out mass production is disclosed. Moreover, the technologies disclosed are not useful in mass production. The present invention aims to overcome the obstacles in the prior art and provide a novel mass-production packaging means and a process therefor.

SUMMARY OF THE INVENTION

In the present invention, a mass-production packaging means suitable for mass-production packaging of an organic luminescent display is provided. The mass-production packaging means of the present invention comprises an atmosphere control system that is used to operate the whole system in a nitrogen atmosphere. A gas circulation/purification system can be used in combination to control the water vapor and oxygen content in the packaging means to be no more than 10 ppm. The atmosphere control system includes a panel feeding system; an UV pretreatment system; a sizing system; a lid feeding system; an alignment/lamination system; an UV irradiation system; a product output system; and a transportation system. The transporation system is used to connect the respective systems and convey the organic electroluminescent display panel from the one system to another system.

In another aspect of the present invention, a mass-production packaging method suitable for mass-production packaging of an organic luminescent display panel on which an organic electroluminescent device is formed is provided. The method of the present invention comprises the steps of: providing a transportation system on the organic electroluminescent display panel; conveying the organic electroluminescent display panel into an UV pretreatment system by the transportation system to clean the surface of the organic electroluminescent display panel; conveying the organic electroluminescent display panel into a sizing system by the transportation system to apply the molding compound on the surface of the organic electroluminescent display panel; conveying the organic electroluminescent display panel system into the alignment/lamination system by the transportation system; conveying a lid into the alignment/lamination system by a lid feeding system; aligning the lid with the organic electroluminescent display panel in the alignment/lamination system and performing the lamination; irradiating the molding compound with UV light to cure the molding compound; and conveying the organic electroluminescent display into a product output system by the transportation system to finish the package thereof.

The UV pretreatment system includes a continuous wave UV system or an UV laser system, which can be chosen as desired. The UV pretreatment system irradiates the organic electroluminescent display panel with UV to clean impurities on the organic electroluminescent display panel in order to increase the adhesion between a molding compound to be applied on the panel. When the continuous wave UV is used in the UV pretreatment system, the organic electroluminescent elements on the organic electroluminescent display panel can be protected by a passivation layer, and the organic electroluminescent display panel then can be treated by irradiation. Alternatively, a shadow mask is used to allow the UV light to irradiate only the portions to be treated. Further, when the UV laser is used in the UV pretreatment system, the panel in question can be aligned mechanically or by using a charge couple device (CCD). The ways to treat the panel with UV laser include: (1) the organic electroluminescent display panel is moved in X and Y directions and scanned by the laser source with constant intervals; and (2) the organic electroluminscent display panel is fixed and scanned in X and Y directions with the UV laser. If the UV pretreatment system is not required, the transportation system will bypass the UV pretreatment system and send the panel to the sizing system.

The sizing system includes at least one sizing head that is used to apply the molding compound on the surface of the panel. However, the undesirably low speed of applying the molding compound by only a sizing head requires more time for a much bigger panel to finish sizing. In consideration of mass production, the sizing system can include more than one sizing head, preferably 6 or 12 sizing heads. The amount of sizing heads can be designed such that the operation time can be decreased and the throughput can be increased. The ways to apply the molding compound by the sizing system can be: (1) the sizing head is fixed in X and Y directions and can be moved only in Z direction. The organic electroluminescent display panel is moved in X and Y directions and the molding compound is applied by the sizing heads; or (2) the organic electroluminescent display panel is fixed and aligned. Then, the sizing head is moved in X, Y and Z directions to apply the molding compound.

Although the lid feeding system serves to send the lid into the alignment/lamination system, the lid can enter the alignment/lamination system through the panel feeding system or the product output system. The lid is aligned with the panel in the alignment/lamination system to perform lamination. The alignment includes mechanical positioning and charge couple device alignment. The pressure can be applied mechanically, pneumatically or hydraulically. The lamination of the panel and the lid can be carried out in two different ways. First, the panel and the lid are pressed together. Spacers can be optionally added between the organic electroluminescent display panel and the lid for further positioning. Second, the distance between the organic electroluminescent display panel and the lid can be controlled by mechanical positioning such that the organic electroluminescent display panel and the lid are pressed until the predetermined position is reached.

The UV irradiation system can provide UV light to cure the molding conpound, completing the packaging process. The UV irradiation system can be used alone or in combination with the alignment/lamination system.

In brief, when the panel and lid are aligned and laminated, the distance therebetween can be controlled as desired. After the desired distance is reached, the molding compound is irradiated with UV light to be cured, and the distance between the panel and the lid is kept constant. The steps of alignment/lamination and UV irradiation can be carried out in separate systems or in the same system. Further, the lamination and the UV irradiation can be performed simultaneously such that the molding compound is cured after the lamination is complete. Moreover, the above-mentioned positions of the lid and the panel can be exchanged.

From a view of the foregoing, the present invention provides a mass-production packaging means for an organic electroluminescent display panel, which has the following advantages:

(1) A plurality of sizing heads are used to apply the molding compound to save the operation time.

(2) The lamination and the UV irradiation can be carried out at the same time, and the distance from the panel to the lid can be adjusted as needed.

(3) The UV pretreatment system can clean the impurities on the panel to increase the adhesion between the molding compound and the panel in order to enhance the effects of the package.

(4) The present invention can be applied to packaging and mass production for a bigger panel.

According to the present invention, an organic electroluminescent display panel, which is subject to photolithographic etching and a film is formed thereon, is referred to as a panel. Materials for the panel and for the lid to cover the panel include glass, plastic, acrylic, polymer and metal. The whole packaging process takes place in a nitrogen or inert gas atmosphere and is controlled by a atmosphere control system, such that the water content is kept no more than 100 ppm and the oxygen content no more than 500 ppm in the packaging process. It is preferable to control the water and oxygen contents at no more than 10 ppm.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

FIGS. 4A and 4B illustrate laminating in the alignment/lamination system according to the first embodiment of the present invention;

FIGS. 6A and 6B illustrate laminating in the alignment/lamination system according to the second embodiment and a third embodiment.

DESCRIPTION OF THE PREFERRED EMBODIMENT

Figure 1:
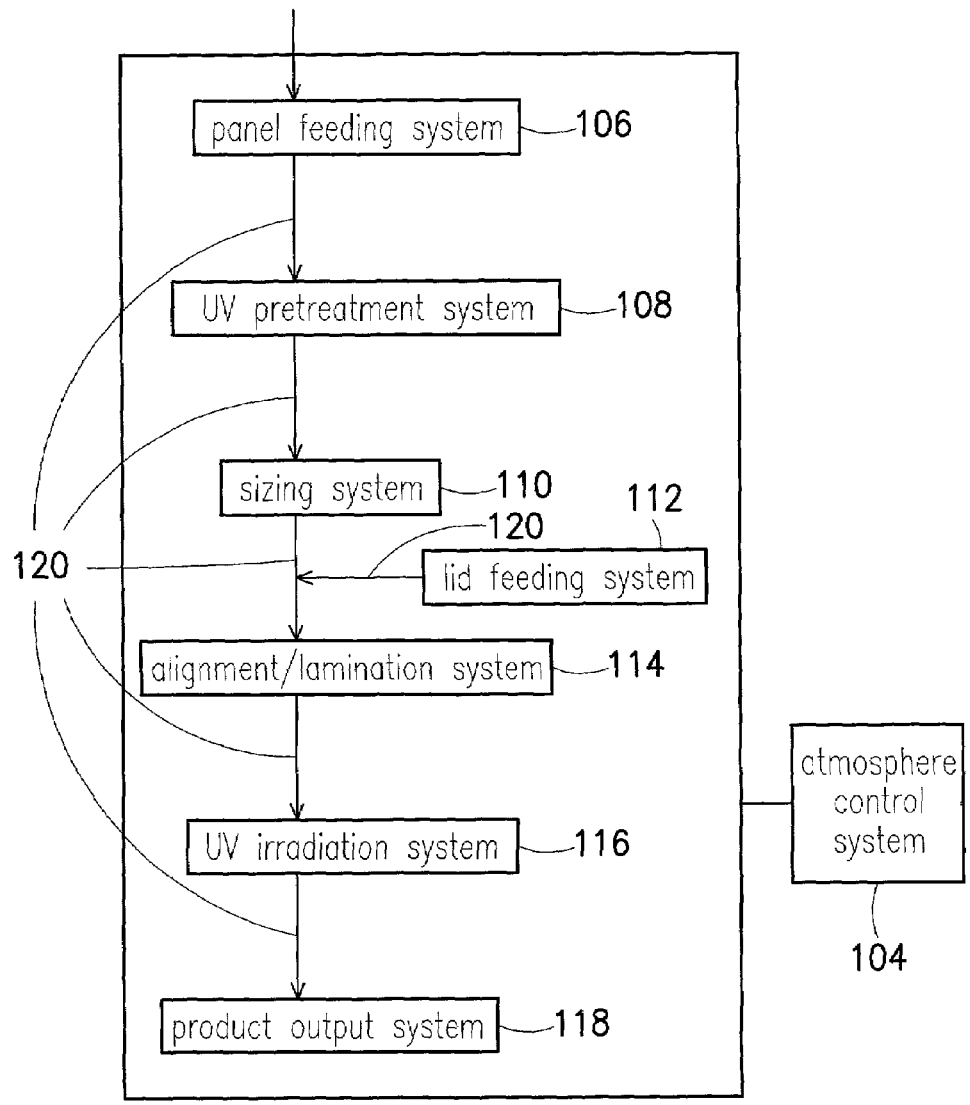
FIG. 1 is a flow chart of a mass-production packaging means according to a first embodiment of the present invention.

Reference will now be made in detail to the present preferred embodiments of the invention, examples of which are illustrated in the accompanying drawings. Whenever possible, the same reference numbers are used in the drawings and the description to refer to the same or like parts.

Embodiment 1

An organic electroluminescent display panel 100 and a lid 102 are first provided (FIGS. 4A and 4B). The material for both can be glass, plastic, acrylic, polymer or metal, for example. The panel 100 and the lid 102 can have dimensions such as 400 cm×400 cm, 370 cm×470 cm or 200 cm×200 cm in size, and 1.1 cm, 0.7 cm or 0.55 cm in thickness.

Referring to FIG. 1, the packaging means includes an atmosphere control system 104. The atmosphere control system has a panel feeding system 106, an UV pretreatment system 108, a sizing system 110, a lid feeding system 112, an alignment and lamination system 114, an UV irradiation system 116, a product output system 118 and a transportation system 120 therein. The atmosphere control system 104 is used to operate the whole system in the nitrogen atmosphere to keep the water vapor and oxygen contents lower than 10 ppm.

In the packaging means, the transference of the organic electroluminescent display panel 100 and the lid 102 is achieved by conveying bands or automatic arms. Referring to FIG. 1, the organic electroluminescent display panel 100 is sent into the atmosphere control system 104 by the transportation system 120. The organic electroluminescent display panel 100 is sent into the UV pretreatment system 108 also by the transportation system 120 from the panel feeding system 106.

Figure 2:
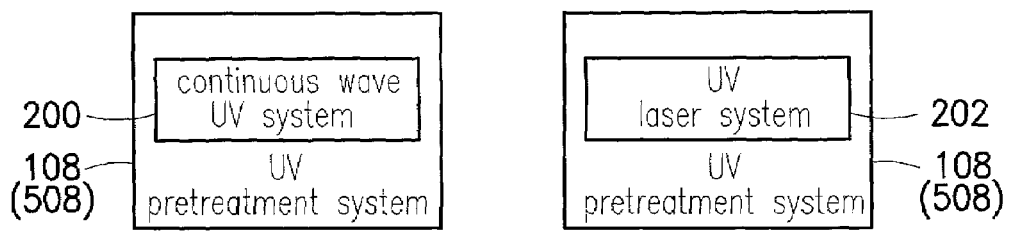
FIG. 2 is a schematic view showing an UV pretreatment device according to a first and second embodiments of the present invention.
Figure 2A:
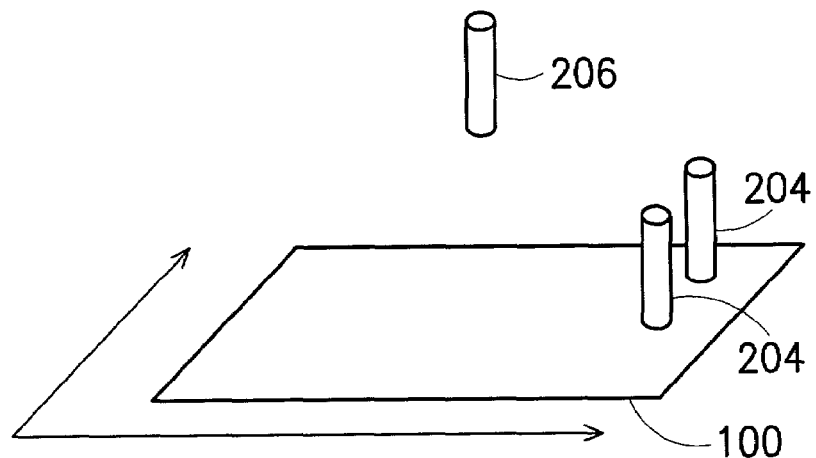
FIGS. 2A and 2B illustrate treating the organic electroluminescent display panel with UV laser according to the first and second embodiments of the present invention.
Figure 2B:
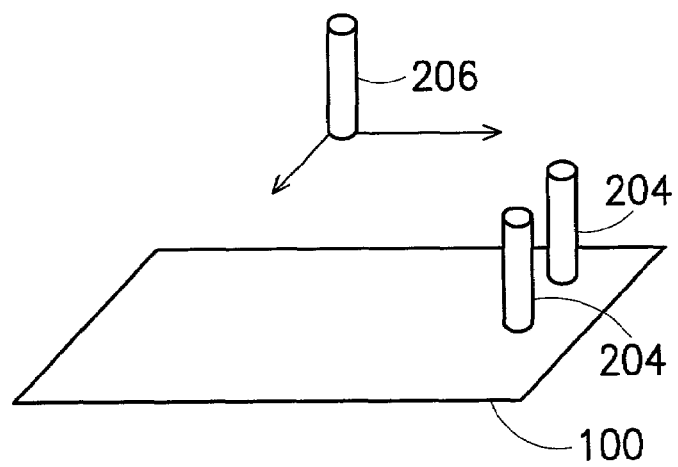

Referring to FIG. 2, the UV pretreatment system 108 includes a continuous wave UV system 200 or an UV laser system 202, which can be chosen as desired. The UV pretreatment system 108 irradiates the organic electroluminescent display panel 100 with UV to clean impurities on the organic electroluminescent display panel in order to increase the adhesion between a molding compound to be applied and the panel 100. When the continuous wave UV is used in the UV pretreatment system 108, the organic electroluminescent elements on the organic electroluminescent display panel 100 can be protected by a passivation layer and the organic electroluminescent display panel 100 can be then treated by irradiation. Alternatively, a shadow mask is used to allow the UV light to irradiate only the portions to be treated. Further, when UV laser is used in the UV pretreatment 108, the panel in question can be aligned mechanically or by using a charge couple device. The ways to treat the panel with UV laser include: (1) Referring to FIG. 2A, the charge couple element 204 is used as an aligned mark for alignment of a laser source 206 and an organic electroluminescent display panel 100. The organic electroluminscent display panel 100 is moved in X and Y directions and scanned by the laser source 206 with constant intervals. (2) Referring to FIG. 2B, the charge couple element 204 is used as an aligned mark for alignment of a laser source 206 and an organic electroluminescent display panel 100. The organic electroluminescent display panel 100 is fixed and scanned in X and Y directions by the laser source 206.

Figure 3A:
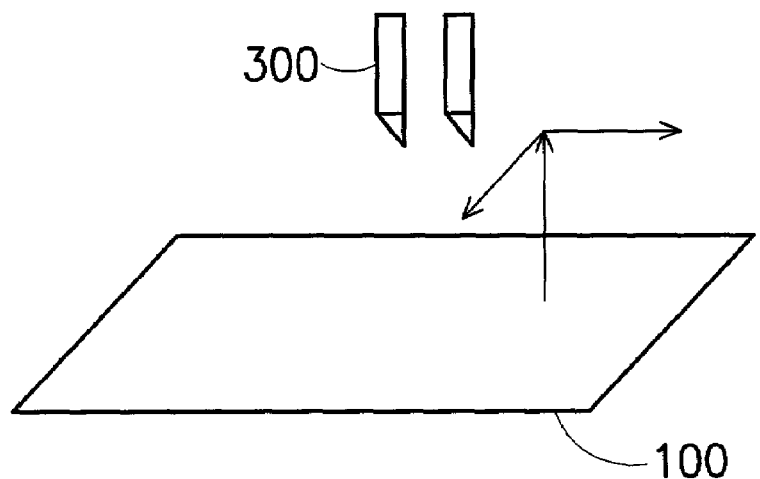
FIGS. 3A and 3B illustrate applying the molding compound by a sizing system according to the present invention.
Figure 3B:
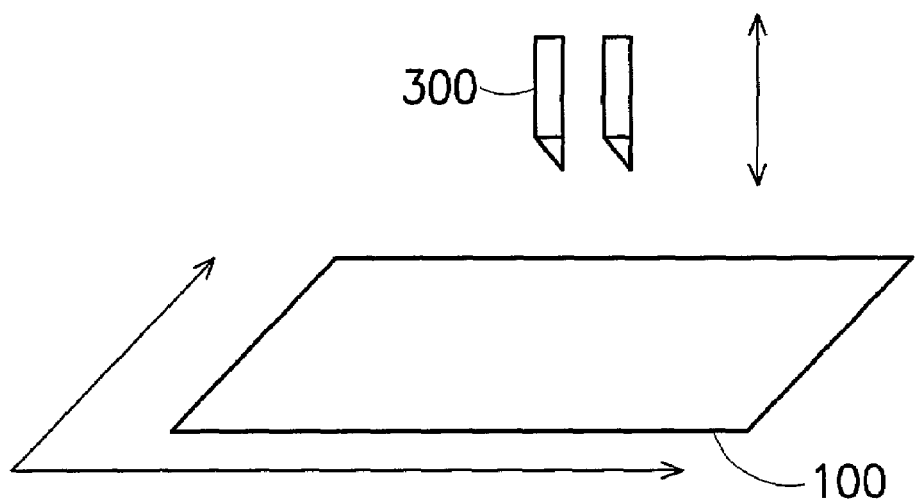

Referring to FIG. 1, the organic electroluminescent display panel 100 is sent into the sizing system 110. The sizing system 110 includes at least one sizing head (not shown in the Figure) which is used to apply the molding compound on the surface of the panel. The molding compound can be UV paste, for example. However, the undesirably low speed of applying the molding compound by only a sizing head requires more time for a much bigger panel to finish sizing. In consideration of mass production, the sizing system 110 can include more than one sizing head, preferably 6 or 12 sizing heads. The amount of sizing heads can be designed such that the operation time can be decreased and the throughput can be increased. The ways to apply the molding compound by the sizing system can be: (1) referring to FIG. 3B, the sizing head 300 is fixed in the X and Y directions and can be moved only in the Z direction. The organic electroluminescent display panel 100 is moved in the X and Y directions and the molding compound is applied by the sizing head 300; or (2) referring to FIG. 3A, the organic electroluminescent display panel 100 is fixed and aligned. Then, the sizing head 300 is moved in the X, Y and Z directions to apply the molding compound.

Subsequently, referring to FIG. 1, the organic electroluminescent display panel 100 is sent into a pair of alignment/lamination systems 114 by the transportation system 120. The lid 102 would be sent into the alignment/lamination system 114 by the lid feeding system 112 as well. Referring to FIG. 4A, the lid 102 is aligned with and pressed to the organic electroluminescent display panel 100 by the alignment/lamination system 114 to combine the lid 102 with the organic electroluminescent display panel 100. The combination of lid 102 and organic electroluminescent display panel 100 can be achieved by pressing both of them, in which spacers (not shown) can be optionally added between the organic electroluminescent display panel 100 and the lid 102 for further positioning. Another embodiment of the present invention is illustrated in FIG. 4B. The distance between the organic electroluminescent display panel 100 and the lid 102 can be controlled by mechanical positioning such that the organic electroluminescent display panel 100 and the lid 102 are pressed until the predetermined position is reached. The alignment includes mechanical positioning and charge couple device alignment. The pressure can be applied mechanically, pneumatically or hydraulically.

After the lamination is finished, the organic electroluminescent display panel 100 is sent into the UV irradiation system 116 by the transportation system 120, as shown in FIG. 1. Referring to FIGS. 4A and 4B, irradiation of UV light is performed to cure the molding compound.

As shown in FIG. 1, the packaged organic electroluminescent display panel 100 is sent into a product output system 118 by the transportation system 120. Subsequent cutting and testing then are performed.

In this example, the feeding positions for the organic electroluminescent display panel 100 and the lid 102 can be exchanged. That is, the panel feeding system 106 and the lid feeding system 112 can be exchanged. In order to save space, the product output system 118 can be used to displace the panel feeding system 106 and the lid feeding system 112 and can be used as an inlet for the organic luminescent display panel 100 and the lid 102.

Embodiment 2

Figure 6B:
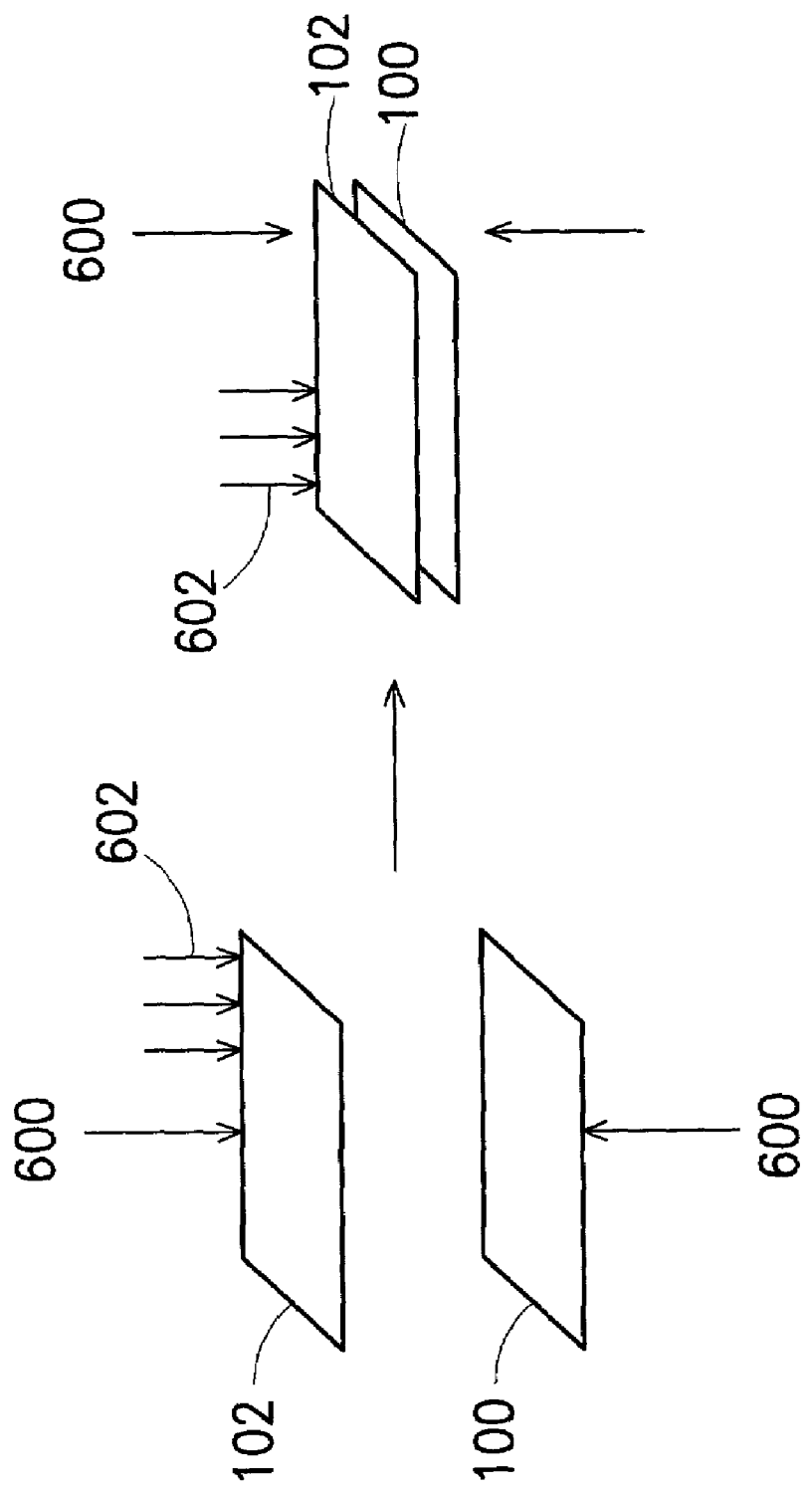

An organic electroluminescent display panel 100 and the lid 102 are first provided (FIGS. 6A and 6B). The material for both can be glass, plastic, acrylic, polymer or metal, for example. The panel 100 and the lid 102 can have dimensions such as 400 cm×400 cm, 370 cm×470 cm or 200 cm×200 cm in size, and 1.1 cm, 0.7 cm or 0.55 cm in thickness.

Figure 5:
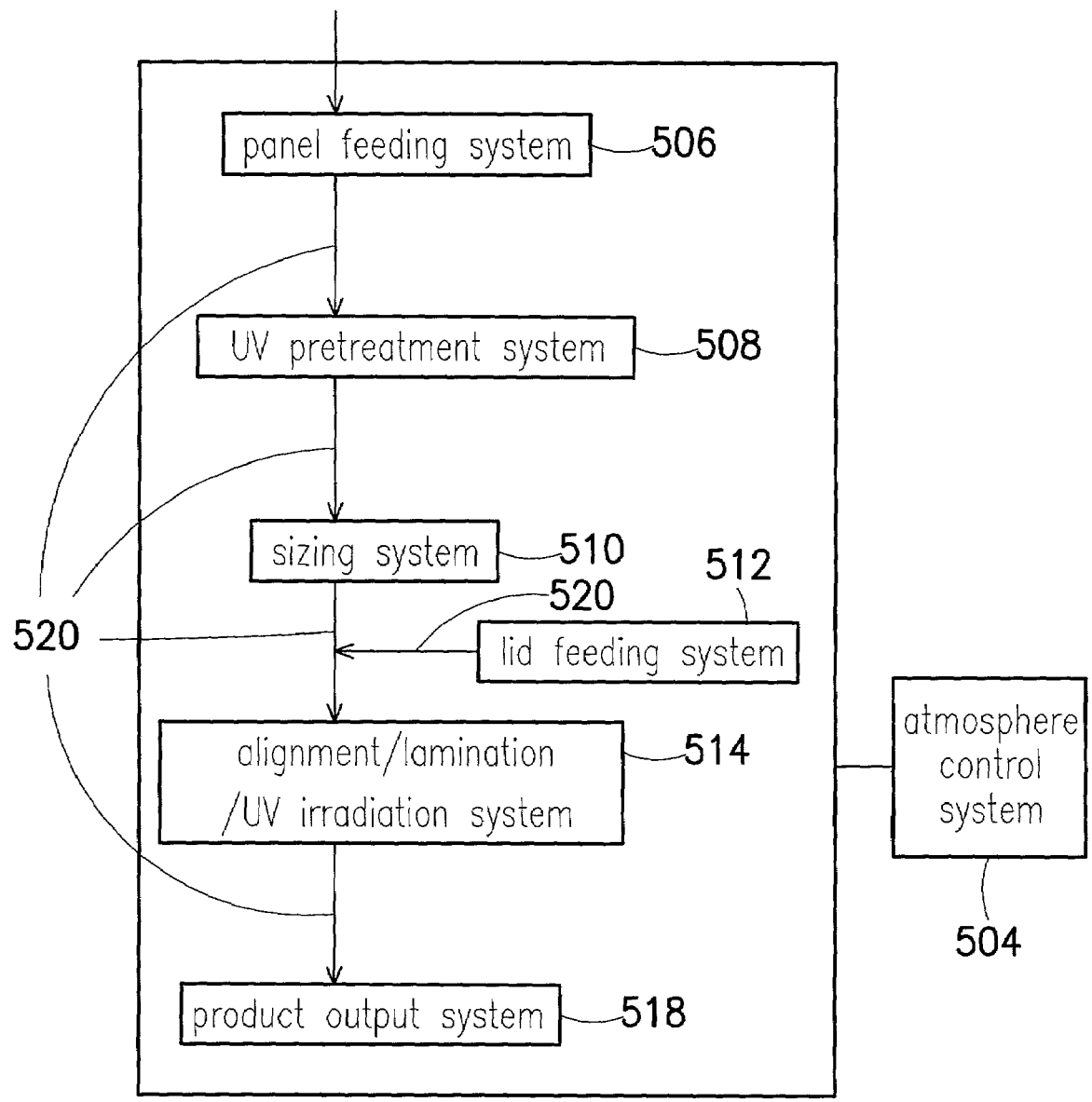
FIG. 5 is a flow chart of a mass-production packaging means according to the second embodiment of the present invention.

Referring to FIG. 5, the packaging means includes an atmosphere control system 504. The atmosphere control system 504 has a panel feeding system 506, an UV pretreatment system 508, a sizing system 510, a lid feeding system 512, an alignment/lamination system 514, a product output system 518 and a transportation system 520 therein. The atmosphere control system 504 is used to operate the whole system in the nitrogen atmosphere to keep the water vapor and oxygen contents lower than 10 ppm.

In the packaging means, the transference of the organic electroluminescent display panel 100 and the lid 102 is achieved by conveying bands or automatic arms. Referring to FIG. 5, the organic electroluminescent display panel 100 is sent into the atmosphere control system 504 by the transportation system 520. The organic electroluminescent display panel 100 is sent into the UV pretreatment system 508 also by the transportation system 520 from the panel feeding system 506.

Referring to FIG. 2, the UV pretreatment system 508 includes a continuous wave UV system 200 or an UV laser system 202, which can be chosen as desired. The UV pretreatment system 508 irradiates the organic electroluminescent display panel 100 with UV to clean impurities on the organic electroluminescent display panel in order to increase the adhesion between a molding compound to be applied and the panel 100. When the continuous wave UV is used in the UV pretreatment system 508, the organic electroluminescent elements on the organic electroluminescent display panel 100 can be protected by a passivation layer, and the organic electroluminescent display panel 100 can be then treated by irradiation. Alternatively, a shadow mask is used to allow the UV light to irradiate only the portions to be treated. Further, when UV laser is used in the UV pretreatment 508, the panel in question can be aligned mechanically or by using a charge couple device. The ways to treat the panel with UV laser include: (1) Referring to FIG. 2A, the charge couple element 204 is used as an aligned mark for alignment of a laser source 206 and an organic electroluminescent display panel 100. The organic electroluminscent display panel 100 is moved in X and Y directions and scanned by the laser source 206 with constant intervals. (2) Referring to FIG. 2B, the charge couple element 204 is used as an aligned mark for alignment of a laser source 206 and an organic electroluminescent display panel 100. The organic electroluminscent display panel 100 is fixed and scanned in X and Y directions by the laser source 206.

Referring to FIG. 5, the organic electroluminescent display panel 100 is sent into the sizing system 510 by the transportation system 520. The sizing system 510 includes at least one sizing head (not shown in the Figures) which is used to apply the molding compound on the surface of the panel. The molding compound can be UV paste, for example. However, the undesirably low speed of applying the molding compound by only a sizing head requires more time for a much bigger panel to finish sizing. In consideration of mass production, the sizing system 510 can include more than one sizing head, preferably 6 or 12 sizing heads. The amount of sizing heads can be designed as required such that the operation time can be decreased and the throughput can be increased. The ways to apply the molding compound by the sizing system can be: (1) referring to FIG. 3B, the sizing head 300 is fixed in X and Y directions and can be moved only in Z direction. The organic electroluminescent display panel 100 is moved in X and Y directions and the molding compound is applied by the sizing head 300; or (2) referring to FIG. 3A, the organic electroluminescent display panel 100 is fixed and aligned. Then, the sizing head 300 is moved in X, Y and Z directions to apply the molding compound.

Subsequently, referring to FIG. 5, the organic electroluminescent display panel 100 is sent into a pair of alignment/lamination systems 514 by the transportation system 520. The lid 102 would be sent into the alignment/lamination system 514 by the lid feeding system 512 as well. Referring to FIG. 6A, the lid 102 is aligned with and pressed to the organic electroluminescent display panel 100 by the alignment/lamination system 514 to combine the lid 102 with the organic electroluminescent display panel 100. The combination of lid 102 and organic electroluminescent display panel 100 can be achieved by lamination, in which spacers (not shown) can be optionally added between the organic electroluminescent display panel 100 and the lid 102 for further positioning. Another embodiment of the present invention is illustrated in FIG. 6B. The distance between the organic electroluminescent display panel 100 and the lid 102 can be controlled by mechanical positioning such that the organic electroluminescent display panel 100 and the lid 102 are pressed until the predetermined position is reached. The alignment includes mechanical positioning and charge couple device alignment. The pressure can be applied mechanically, pneumatically or hydraulically. Referring to FIGS. 6A and 6B, in lamination, the alignment/lamination/UV irradiation system 514 provides UV light 602. Once the lamination is complete, the molding compound is cured. Further, the irradiation of UV light 602 can be carried out after the lamination.

As shown in FIG. 5, the packaged organic electroluminescent display panel 100 is sent into a product output system 518 by the transportation system 520. Subsequent cutting and testing then are performed.

In this example, the feeding positions for the organic electroluminescent display panel 100 and the lid 102 can be exchanged. That is, the panel feeding system 506 and the lid feeding system 512 can be exchanged. In order to save space, the product output system 518 can be used to displace the panel feeding system 506 and the lid feeding system 512 and can be used as an inlet for the organic luminescent display panel 100 and the lid 102.

Embodiment 3

An organic electroluminescent display panel 100 and the lid 102 are first provided (FIGS. 6A and 6B). The material for both can be glass, plastic, acrylic, polymer or metal, for example. The panel 100 and the lid 102 can have dimensions such as 400 cm×400 cm, 370 cm×470 cm or 200 cm×200 cm in size, and 1.1 cm, 0.7 cm or 0.55 cm in thickness.

Figure 7:
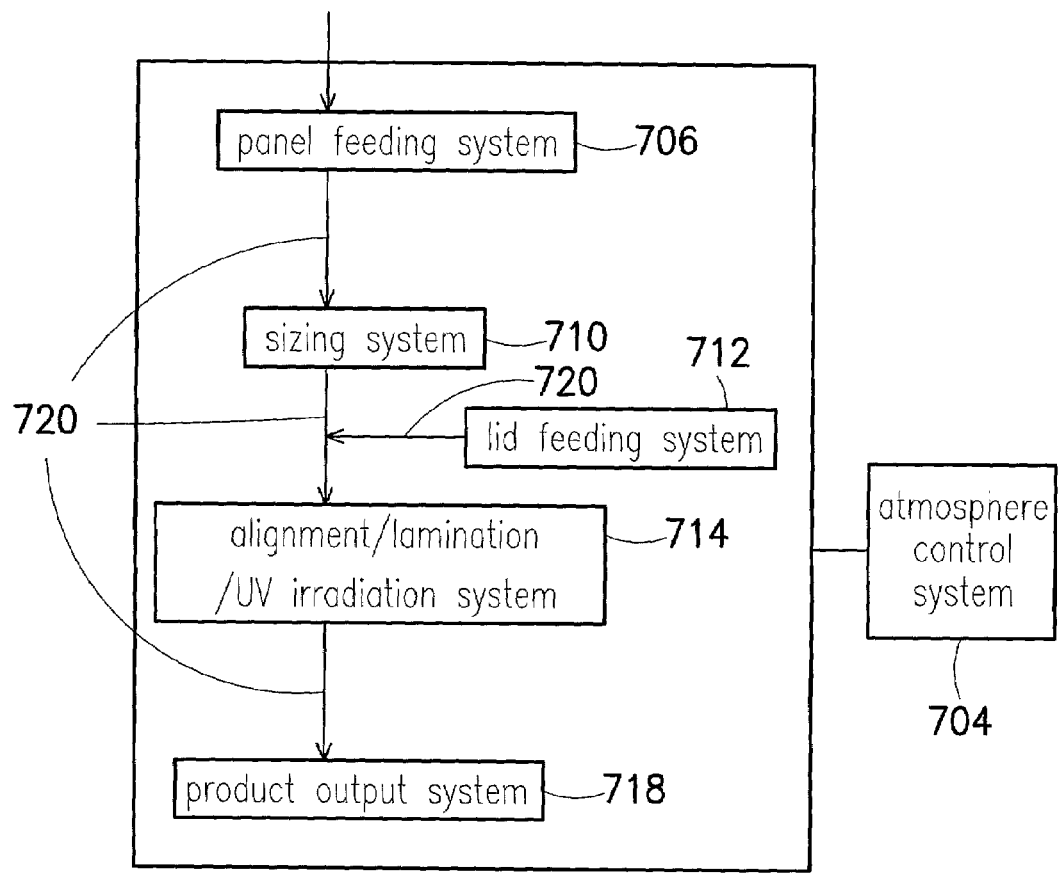
FIG. 7 is a schematic view of a mass-production packaging means according to the third embodiment of the present invention.

Referring to FIG. 7, the packaging means includes an atmosphere control system 704. The atmosphere control system 704 has a panel feeding system 706, a sizing system 710, a lid feeding system 712, an alignment/lamination/UV irradiation system 714, a product output system 718 and a transportation system 720 therein. The atmosphere control system 704 is used to operate the whole system in a nitrogen atmosphere to keep the water vapor and oxygen contents lower than 10 ppm.

In the packaging means, the transference of the organic electroluminescent display panel 100 and the lid 102 is achieved by conveying bands or automatic arms. Referring to FIG. 7, the organic electroluminescent display panel 100 is sent into the atmosphere control system 704 by the transportation system 720. The organic electroluminescent display panel 100 is sent into the panel feeding system 706 also by the transportation system 720. The sizing system 710 includes at least one sizing head (not shown) which is used to apply the molding compound on the surface of the panel. The molding compound can be UV paste, for example. However, the undesirably low speed of applying the molding compound by only a sizing head requires more time for a much bigger panel to finish sizing. In consideration of mass production, the sizing system 710 can include more than one sizing head, preferably 6 or 12 sizing heads. The amount of sizing heads can be designed as required such that the operation time can be decreased and the throughput can be increased. The ways to apply the molding compound by the sizing system can be: (1) referring to FIG. 3B, the sizing head 300 is fixed in X and Y directions and can be moved only in Z direction. The organic electroluminescent display panel 100 is moved in X and Y directions and the molding compound is applied by the sizing head 300; or (2) referring FIG. 3A, the organic electroluminescent display panel 100 is fixed and aligned. Then, the sizing head 300 is moved in X, Y and Z directions to apply the molding compound.

Subsequently, referring to FIG. 7, the organic electroluminescent display panel 100 is sent into a pair of alignment/lamination systems 714 by the transportation system 720. The lid 102 would be sent into the alignment/lamination/UV irradiation system 714 by the lid feeding system 712 as well. Referring to FIG. 6A, the lid 102 is aligned with and pressed to the organic electroluminescent display panel 100 by the alignment/lamination system 714 to combine the lid 102 with the organic electroluminescent display panel 100. The combination of lid 102 and organic electroluminescent display panel 100 can be achieved by lamination, in which spacers (not shown) can be optionally added between the organic electroluminescent display panel 100 and the lid 102 for further positioning. Another embodiment of the present invention is illustrated in FIG. 6B. The distance between the organic electroluminescent display panel 100 and the lid 102 can be controlled by mechanical positioning such that the organic electroluminescent display panel 100 and the lid 102 are pressed until the predetermined position is reached. The alignment includes mechanical positioning and charge couple device alignment. The pressure can be applied mechanically, pneumatically or hydraulically. Referring to FIGS. 6A and 6B, in lamination, the alignment/lamination/UV irradiation system 714 provides UV light 602. Once the lamination is complete, the molding compound is cured. Further, the irradiation of UV light 602 can be carried out after the lamination.

As shown in FIG. 7, the packaged organic electroluminescent display panel 100 is sent into a product output system 718 by the transportation system 720. Subsequent cutting and testing then are performed.

In this example, the feeding positions for the organic electroluminescent display panel 100 and the lid 102 can be exchanged. That is, the panel feeding system 706 and the lid feeding system 712 can be exchanged. In order to save space, the product output system 718 can be used to displace the panel feeding system 706 and the lid feeding system 712 and can be used as an inlet for the organic luminescent display panel 100 and the lid 102.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A mass-production packaging means suitable for mass-production packaging of an organic luminescent display, comprising at least:
    a panel feeding system used to send an organic luminescent display panel into the mass-production packaging means;
    an UV pretreatment system used to clean the surface of the organic luminescent display panel;
    a sizing system used to apply the cleaned surface of the organic electroluminescent display panel with a molding compound;
    a lid feeding system used to send a lid into the mass-production packaging means;
    an alignment/lamination system used to align the lid with the organic electroluminescent display panel and perform the lamination;
    an UV irradiation system used to provide UV light to cure the molding compound;
    a product output system used to convey one of the packaged products outside of the packaging means;
    a transportation system used to convey the organic electroluminescent display panel to the panel feeding system, the UV pretreatment system, the sizing system, the lid feeding system, the alignment/lamination system, the UV irradiation system and the product output system in a continuous way; and
    an atmosphere control system used to control water vapor and oxygen content in the packaging means.

2. The mass-production packaging means of claim 1, wherein the materials for the organic electroluminescent display panel and for the lid are chosen from a group consisting of glass, plastic, acrylic, polymer and metal.

3. The mass-production packaging means of claim 1, wherein the transportation system is a conveying band or an automatic arm.

4. The mass-production packaging means of claim 1, wherein the UV pretreatment system includes a continuous wave UV system or an UV laser system.

5. The mass-production packaging means of claim 4, wherein the UV pretreatment system provide UV laser by the UV laser system for scanning the organic electroluminescent display panel in X and Y directions.

6. The mass-production packaging means of claim 4, wherein the UV pretreatment system provide UV laser by the UV laser system for scanning organic electroluminescent display panel at constant intervals with the UV laser when the organic electroluminescent display panel is moved in X and Y directions.

7. The mass-production packaging means of claim 1, wherein the sizing system comprises at least two sizing heads, the sizing heads are suitable for moving in X, Y and Z directions to apply the molding compound on the organic electroluminescent panel.

8. The mass-production packaging means of claim 1, wherein the sizing system comprises at least two sizing heads, the sizing heads are suitable for moving only in Z direction to apply the molding compound on the organic electroluminescent panel, while the organic electroluminescent display panel is suitable for moving in X and Y directions.

9. The mass-production packaging means of claim 1, wherein the molding compound is an UV paste.

* * * * *